(12) United States Patent
Ryoo et al.

(10) Patent No.: US 6,519,188 B2
(45) Date of Patent: Feb. 11, 2003

(54) CIRCUIT AND METHOD FOR CONTROLLING BUFFERS IN SEMICONDUCTOR MEMORY DEVICE

(75) Inventors: Ki Hyung Ryoo, Seoul (KR); Young Jin Yoon, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/005,877

(22) Filed: Dec. 7, 2001

(65) Prior Publication Data

US 2002/0083289 A1 Jun. 27, 2002

(30) Foreign Application Priority Data

Dec. 18, 2000 (KR) ........................................ 2000-77738
Jun. 30, 2001 (KR) ........................................ 2001-39028

(51) Int. Cl.[7] .............................. G11C 7/00; G11C 8/00
(52) U.S. Cl. .................. 365/189.05; 365/194; 365/233
(58) Field of Search ........................... 365/189.05, 193, 365/194, 230.03, 230.06, 230.08, 233

(56) References Cited

U.S. PATENT DOCUMENTS

| 5,222,042 | A | 6/1993 | Ichiguchi | 365/203 |
|---|---|---|---|---|
| 5,278,803 | A | 1/1994 | Wanner | 365/233 |
| 5,771,199 | A | 6/1998 | Lee | 365/233 |
| 5,798,969 | A | 8/1998 | Yoo et al. | 365/233 |
| 5,798,978 | A | 8/1998 | Yoo et al. | 365/233 |
| 5,844,857 | A | 12/1998 | Son et al. | 365/230.06 |
| 5,856,952 | A | 1/1999 | Yoo et al. | 365/233 |
| 5,923,610 | A | 7/1999 | Te | 365/230.06 |
| 5,973,989 | A | 10/1999 | Pawlowski | 365/233 |
| RE36,532 | E | 1/2000 | Kim | 365/203 |
| 6,021,081 | A | 2/2000 | Higashide et al. | 365/226 |
| 6,101,144 | A | 8/2000 | Jo | 365/233 |
| 6,215,837 | B1 | 4/2001 | Yi | 365/236 |
| 6,301,189 | B1 * | 10/2001 | Bae | 365/233 |
| 6,314,050 | B1 * | 11/2001 | Yi et al. | 365/233 |
| 6,324,119 | B1 * | 11/2001 | Kim | 365/233 |
| 6,356,502 | B1 * | 3/2002 | Yi | 365/230.06 |

FOREIGN PATENT DOCUMENTS

| JP | 7-141870 | 6/1995 |
|---|---|---|
| JP | 7-201181 | 8/1995 |
| JP | 11-339480 | 12/1995 |
| JP | 2000-200481 | 7/2000 |

* cited by examiner

*Primary Examiner*—Trong Phan
(74) *Attorney, Agent, or Firm*—Pillsbury Winthrop LLP (57) ABSTRACT

Disclosed inventions include circuits and methods for controlling a plurality of data input buffers and a plurality data strobe buffers in a semiconductor memory device. High speed operation can be achieved by operating the plurality of data input buffers and the plurality of data strobe buffers in response to a buffer control signal generated faster than an input data, synchronized with internal rising and falling clock signals. A first internal falling clock signal generator generates a first internal falling clock signal in response to an external clock signal. A first internal rising clock signal generator generates a first internal rising clock signal in response to the external clock signal. A buffer controller generates a buffer control signal in response to the first and falling and rising clock signals. The plurality of data input buffers and the plurality of data strobe buffer are enabled or disabled in response to the buffer control signal.

20 Claims, 6 Drawing Sheets

CIRCUIT AND METHOD FOR CONTROLLING BUFFERS IN SEMICONDUCTOR MEMORY DEVICE

BACKGROUND

1. Field of the Invention

The inventions described in this patent document generally relate to circuits and methods for controlling buffers in a semiconductor memory device. More particularly they relate to circuits and methods for controlling a data input buffer and a data strobe buffer in response to internal rising and falling clock signals generated synchronously in response to an external clock signal.

2. General Background and Related Art

A data input buffer usually detects data input from an external source, and holds the external sourced data until it is stored in a memory cell. However, because the data input buffer is enabled in response to an internal clock signal, which is triggered by an external clock signal, it can be enabled later than when input data is inputted into the data input buffer.

Figure 1:
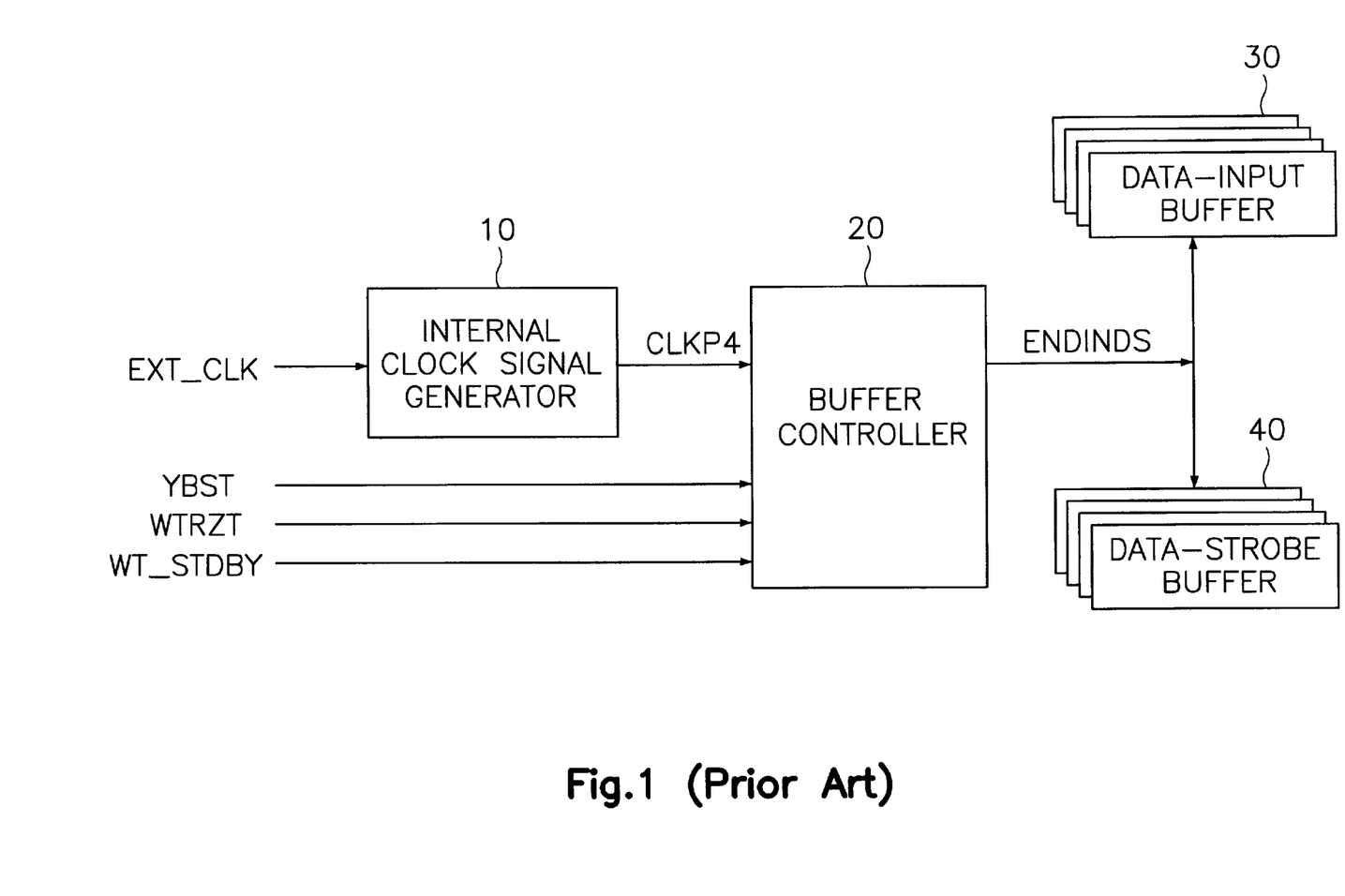
FIG. 1 (Prior Art) is a block diagram of a conventional buffer control circuit in a semiconductor memory device.

FIG. 1 (Prior Art) is a block diagram of a conventional buffer control circuit for a semiconductor memory device. The buffer control circuit comprises an internal clock signal generator 10, a buffer controller 20, a plurality of data input buffers 30, and a plurality of data strobe buffers 40. The internal clock signal generator 10 generates an internal clock signal CLKP4 in response to an external clock signal EXT_CLK. The buffer controller 20 receives a write standby signal WT_STDBY, a write operation enable signal WTRZT (it is at high level during a write operation, and is at low level during a read operation), and a burst operation signal YBST, and then generates a buffer control signal ENDINDS. The write operation enable signal WTRZT and the write standby signal WT_STDBY are generated in response to a write command signal output from a command decoder (not shown). The plurality of data input buffers 30 and the plurality of data strobe buffers 40 are enabled or disabled in response to the buffer control signal ENDINDS.

Figure 2:
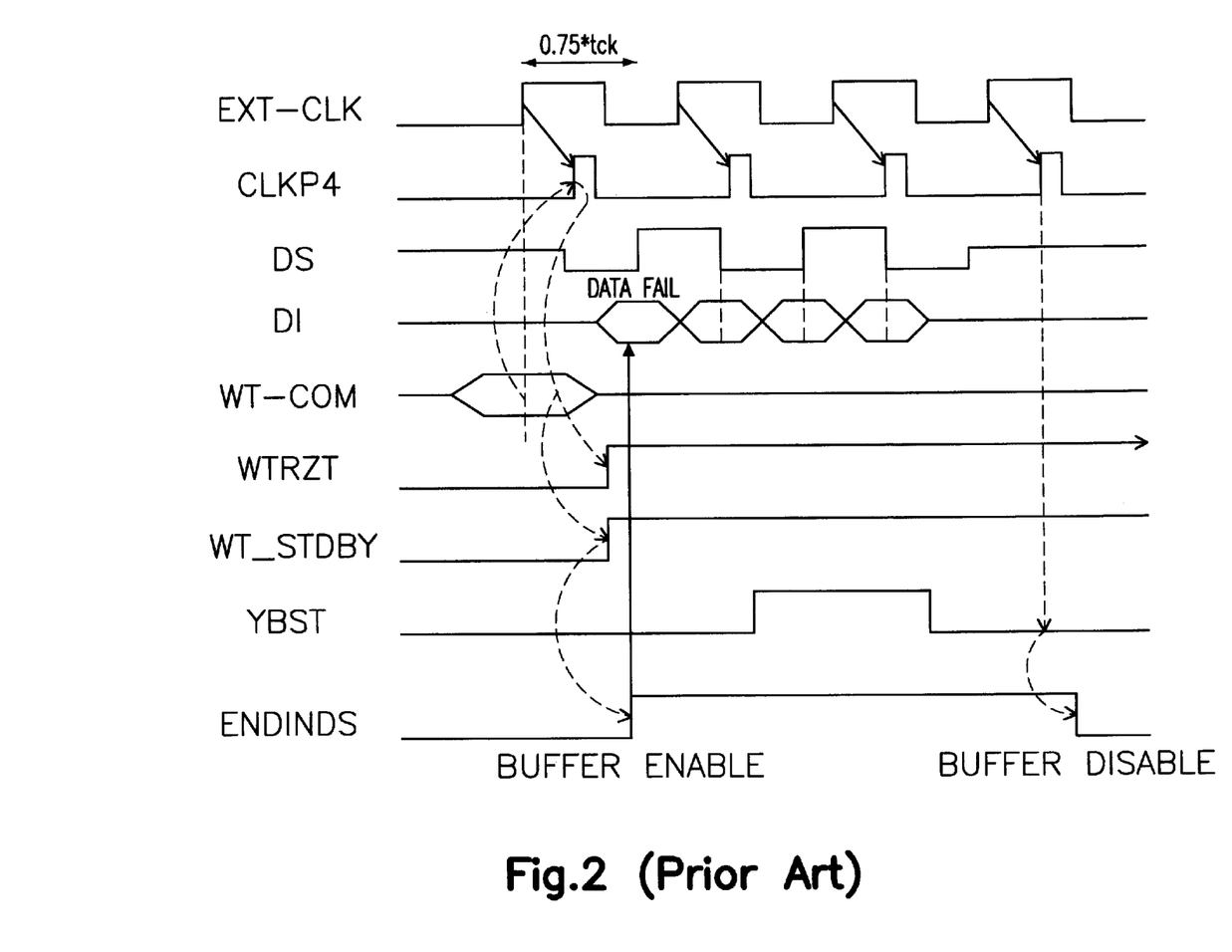
FIG. 2 (Prior Art) is a timing diagram of main signals in the conventional buffer control circuit of the semiconductor memory device.

The FIG. 1 (Prior Art) arrangement operates as shown in FIG. 2 (Prior Art) which is a timing diagram. The internal clock signal CLKP4 is triggered by the external clock signal EXT_CLK. The write operation enable signal WTRZT and the write standby signal WT_STDBY are enabled at high level in response to the internal clock signal CLKP4. The buffer control signal ENDINS is enabled at high level in response to the write standby signal WT_STDBY, and then is disabled at low level when the burst operation signal YBST is at low level.

In the conventional buffer control circuit, because the input data DI in inputted into DRAM synchronously in response to a data strobe signal DS delayed by 0.75*tck to 1.25*tck (tck=one period of time of the external clock EXT_CLK), it is more quickly inputted into the DRAM as the period of the external clock EXT_CLK (=tck) gets shorter. The data strobe signal DS is generated synchronously in response to the external clock signal EXT_CLK.

On the other hand, because the buffer control signal ENDINDS is generated in response to the write operation enable signal WTRZT and the write standby signal WT_STDBY which are enabled at high level synchronously in response to the internal clock signal CLK4, it can be enabled later than the input data DI inputted synchronously in response to the external clock signal EXT_CLK. As a result, it difficult to realize high-speed operation of a semiconductor memory device.

SUMMARY

Accordingly, this patent document describes inventions including circuits and methods for generating a buffer control signal synchronously in response to internal rising and falling clock signals synchronized with an external clock signal, and operating data input buffers and data strobe buffers in response to the buffer control signal, thereby enabling the data input buffers and data strobe buffers before the input data is inputted thereinto, and achieving a stable high speed operation in a semiconductor memory device.

The arrangements and methods described herein minimize unnecessary power consumption in the high-speed operation by operating the data input buffers only at a write operation region.

Among the various inventions described herein there is described a buffer control circuit for a semiconductor memory device. The buffer control circuit includes a first internal falling clock signal generator for generating a first internal falling clock signal from an external clock signal, and a first internal rising clock signal generator for generating a first internal rising clock signal from the external clock signal. A buffer controller generates a buffer control signal in response to the first and second falling and rising clock signals. A plurality of data input buffers and a plurality of data strobe buffers are enabled or disabled in accordance with the buffer control signal.

There is described a method for controlling a plurality of data input buffers and a plurality of data strobe buffers in a semiconductor memory device. The method includes: generating a first internal falling clock signal and a first internal rising clock signal synchronized with an external clock signal; generating a buffer control signal in response to the first internal rising clock signal, the first internal falling clock signal, and a write standby signal; and enabling or disabling the plurality of data input buffers and the plurality of data strobe buffers in accordance with the buffer control signal.

The foregoing is merely exemplary. Additional features and advantages of the inventions will be more fully appreciated in light of the detailed description, read in conjunction with the accompanying drawings.

BRIEF DESCRIPTION OF THE DRAWINGS

The inventions claimed herein will be explained and supported by the following detailed description when read in conjunction with the accompanying drawings, in which:

DETAILED DESCRIPTION

This detailed description describes presently preferred embodiments supporting claimed inventions. It is merely illustrative and it should not be taken in a limiting sense. In the following detailed description, various specific and detailed arrangements are described in order to provide a thorough understanding of the present invention. It will be apparent, however, to one skilled in the art that the present invention may be practiced without these specific details or using a different detailed arrangement.

Figure 3:
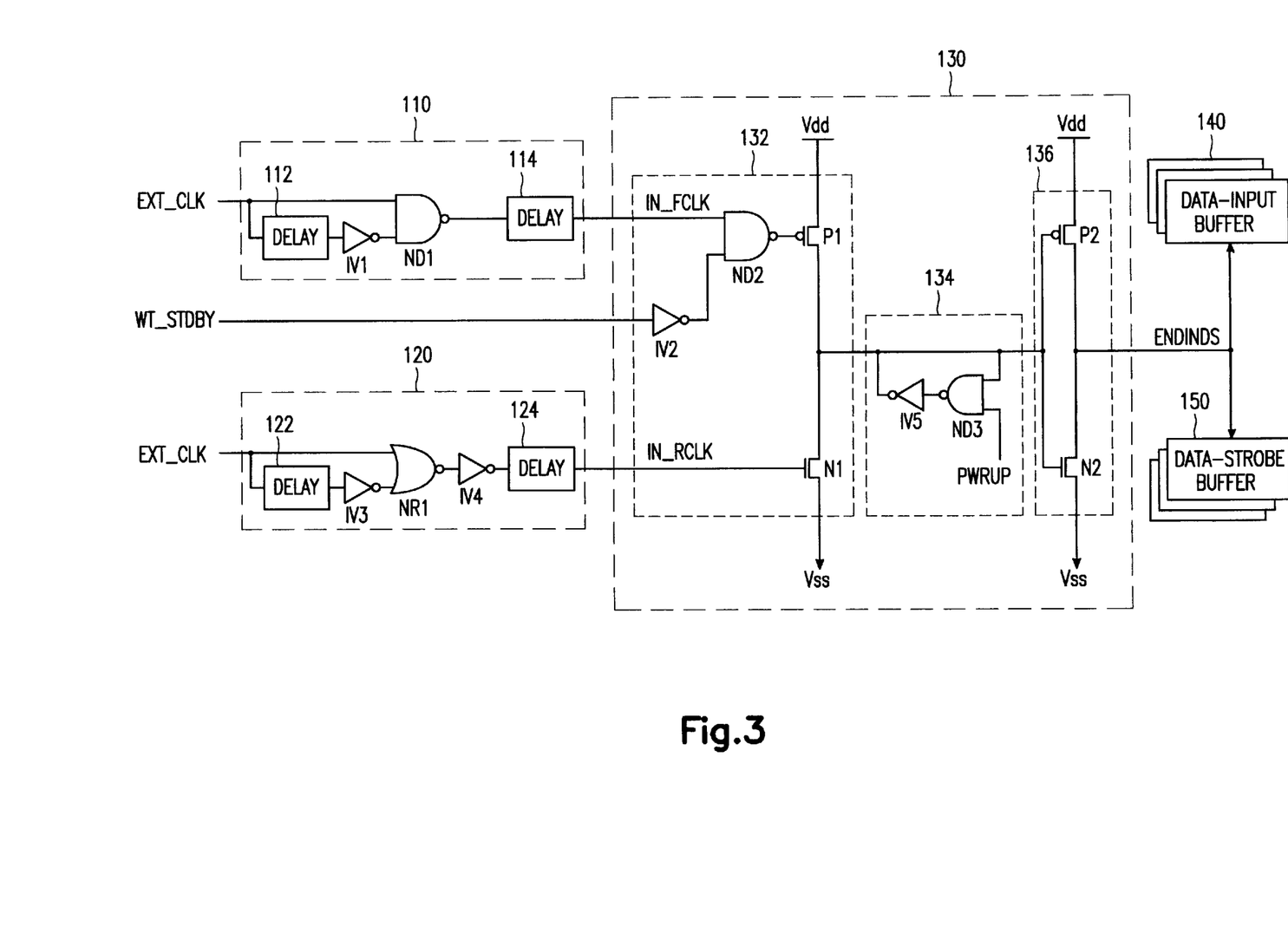
FIG. 3 is a circuit diagram showing the buffer control circuit of the semiconductor memory device according to a first embodiment of the present invention.

A buffer control circuit of a semiconductor memory device according to a preferable embodiment of the invention is adapted to realize a stable high speed operation and to minimize the unnecessary power consumption at a high speed operation. FIG. 3 shows the buffer control circuit according to the first embodiment of the invention.

Referring to FIG. 3, the buffer control circuit comprises an internal falling clock signal generator 110, an internal rising clock signal generator 120, a buffer controller 130, a plurality of data input buffers 140, and a plurality of data strobe buffers 150.

The internal falling clock signal generator 110 generates an internal falling clock signal IN_FCLK synchronized with a falling edge of an external clock signal EXT_CLK. The internal rising clock signal generator 120 produces an internal rising clock signal IN_RCLK, synchronized with a rising edge of the external clock signal EXT_CLK.

Here, the internal falling clock signal generator 110 includes a delay unit 112 for delaying the external clock signal EXT_CLK, an inverter IV1 for inverting an output signal of the delay unit 112, a NAND gate ND1 for logically combining an output signal of the inverter IV1 with the external clock signal EXT_CLK, and a delay unit 114 for delaying an output signal of the NAND gate ND1.

The internal rising clock signal generator 120 includes a delay unit 122 for delaying the external clock signal EXT_CLK, an inverter IV3 for inverting an output signal of the delay unit 122, a NOR gate NR1 for logically combining an output signal of the inverter IV3 with the external clock signal EXT_CLK, and an inverter IV4 for inverting an output signal of the NOR gate NR1, and a delay unit 124 for delaying an output signal of the inverter IV4.

Next, the buffer controller 130 receives the internal falling clock signal IN_FCLK, the internal rising clock signal IN_RCLK, and a write standby signal WT_STDBY, and generates a buffer control signal ENDINDS, synchronized with the internal rising and falling clock signals IN_RCLK and IN_FCLK.

And, the plurality of data input buffers 140 and the plurality of data strobe buffers 150 are enabled or disabled in response to the buffer control signal ENDINDS.

Here, the buffer controller 130 includes a first driver 132 for pulling up and pulling down the internal falling clock signal IN_FCLK, the internal rising clock signal IN_RCLK, and the write standby signal WT_STDBY, a latch circuit 134 for latching an output signal of the first driver 132 and a power-up signal PWRUP, and a second driver 136 for receiving an output signal of the latch circuit 134 and then generating the buffer control signal ENDINDS.

The first driver 132 includes an inverter IV2 for inverting the write standby signal WT_STDBY, an NAND gate ND2 for logically combining an output signal of the inverter IV2 and the internal falling clock signal IN_FCLK, a PMOS transistor P1 for pulling up an output signal of the NAND gate ND2, and an NMOS transistor N1 for pulling down the internal rising clock signal IN_RCLK.

The latch circuit 134 includes a NAND gate ND3 for logically combining an output signal of the first driving unit 132 with the power-up signal PWRUP, and an inverter IV5 for inverting an output signal of the NAND gate ND3.

The second driver 136 includes PMOS and NMOS transistors P2 and N2 of inverter type for inverting an output signal of the latch circuit 134 and then generating the buffer control signal ENDINDS.

Figure 4:
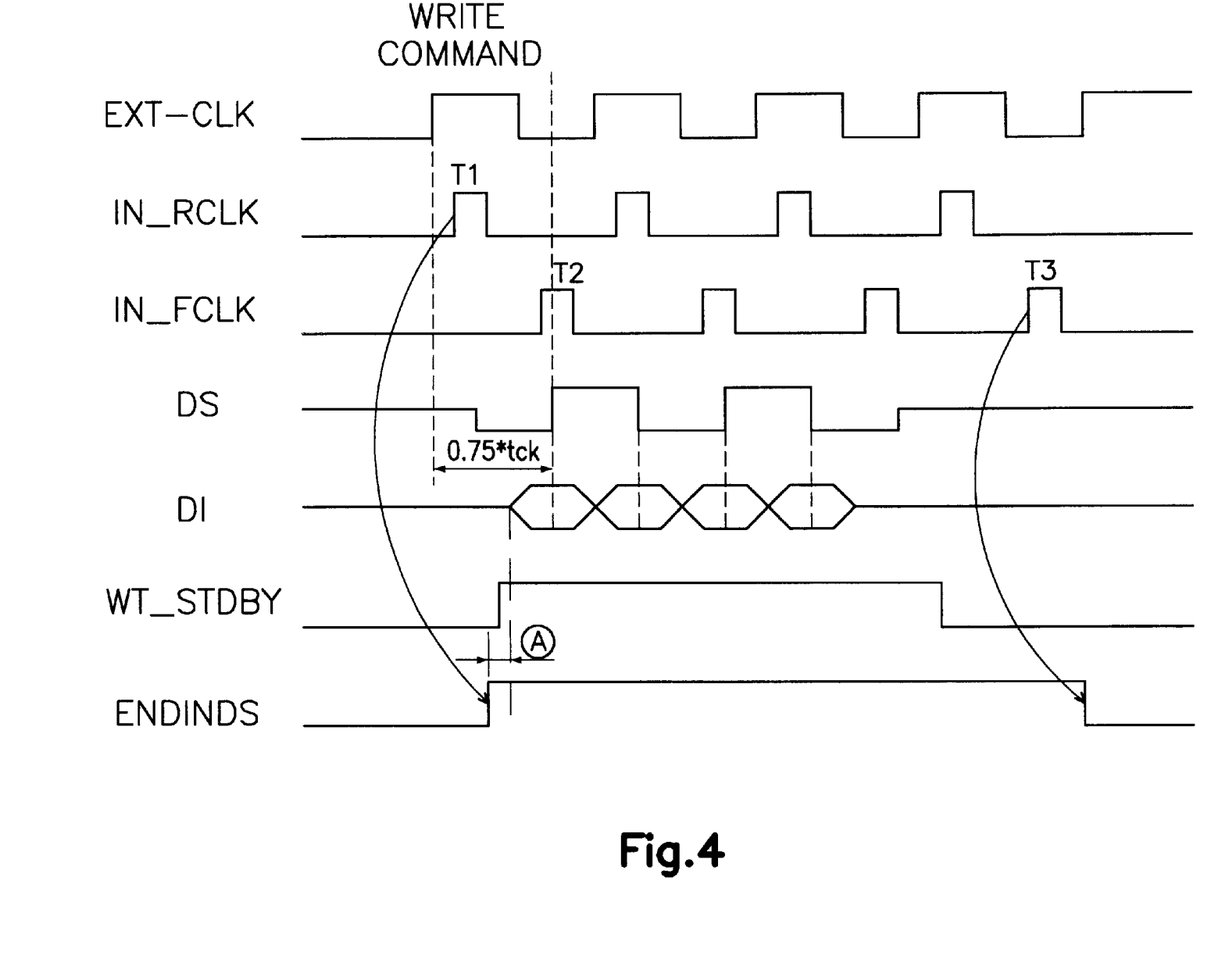
FIG. 4 is a timing diagram of main signals in the buffer control circuit of the semiconductor memory device according to the first embodiment of the invention.

FIG. 4 is a timing diagram showing that the buffer control signal ENDINDS for controlling the enable of the data buffers is generated faster than when an input data is inputted into the data buffers.

First, signals shown in FIG. 4 will be described. The internal rising clock signal IN_RCLK may use a DLL (Delay Lock Loop) clock signal. And, the internal falling clock signal IN_FCLK is generated after being delayed as much as 0.5*tck from the internal clock signal IN_RCLK. And the write standby signal WT_STDBY is generated in response to the write command signal output from a command decoder (not shown).

As shown in FIG. 4, the buffer control signal ENDINDS is enabled at a high level synchronously in response to a rising edge of a pulse T1 of the internal rising clock signal IN_RCLK before a pulse T2 of the internal falling clock signal IN_FCLK is generated.

Here, the pulse T2 of the internal falling clock signal IN_FCLK is generated after the generation of the pulse T1 of the internal rising clock signal IN_RCLK. The pulse T2 of the internal falling clock signal IN_FCLK determines whether the buffer control signal ENDINDS is enabled or disabled in accordance with the level of the write standby signal WT_STDBY (it is at a high level only during the write operation). That is, if the write standby signal WT_STDBY is at a high level when the pulse T2 of the internal falling clock signal IN_FCLK is generated, the buffer control signal ENDINDS is maintained at a high level. As a result, the plurality of data input buffers 140 and the plurality of data strobe buffers 150 are enabled at a high level.

If the write standby signal WT_STDBY is at a low level when a pulse T3 of the internal falling clock signal IN_FALL_CLK is generated, the buffer control signal ENDINDS goes down to a low level, thereby disabling the plurality of data input buffers 140 and the plurality data strobe buffers 150.

The buffer control circuit described as the first embodiment generates the buffer control signal ENDINDS synchronized with the internal rising clock signal IN_RCLK and the internal falling clock signal IN_FCLK, and operates the plurality of data input buffers 140 and the plurality of data strobe buffers 150 in response to the buffer control signal ENDINDS, thereby enabling the plurality of data input buffers 140 and the plurality of data strobe buffers 150 before the input data is inputted into the data buffers.

The data input buffers 140 and the data strobe buffers 150 are enabled faster as much as an A interval than when the input data is inputted thereinto, resulting in achieving the data input buffers 140 and the data strobe buffer 150 capable of stably receiving the input data even at a high speed operation.

Figure 5:
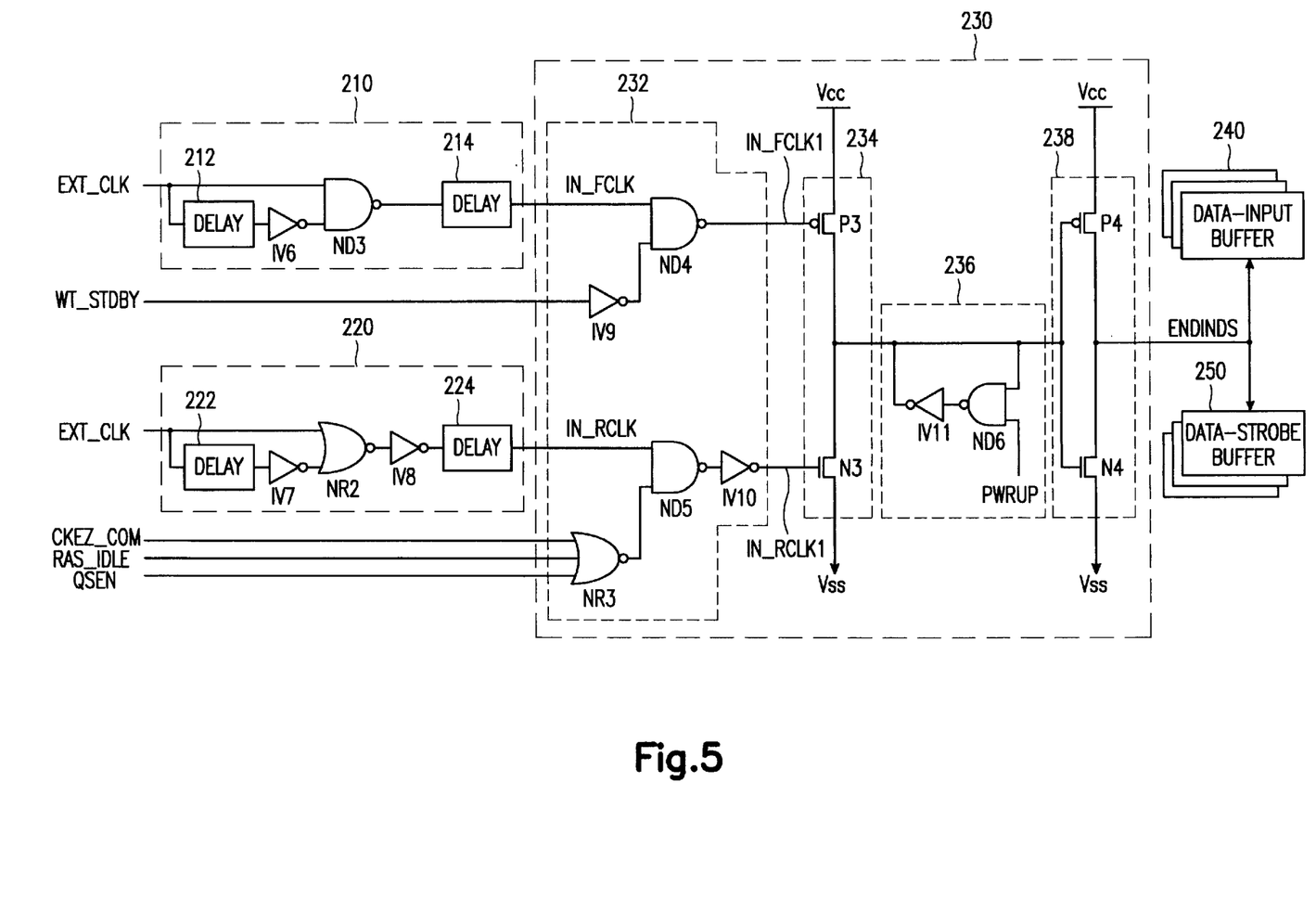
FIG. 5 is a circuit diagram showing the buffer control circuit of the semiconductor memory device according to a second embodiment of the invention.

Next, the buffer control circuit according to a second embodiment of the present invention will be described with reference to FIG. 5. The buffer control circuit comprises the first internal falling clock signal generator 210, the first internal rising clock signal generator 220, a buffer controller 230, a plurality of data input buffers 240, and a plurality of input strobe buffers 250.

The buffer control circuit generates second internal rising and falling clock signals IN_RCLK1 and IN_FCLK1 in response to first internal rising and falling clock signals IN_RCLK and IN_FCLK, a write standby signal WT_STDBY, an external clock enable signal CKEZ_COM, a RAS (row strobe signal) idle signal RAS_IDLE, and an output enable signal (QSEN), and then operates the plurality of data input buffers 240 and the plurality of data strobe buffer 250 only at an write operation region synchronously in response to the second internal rising and falling clock signals IN_RCLK1 and IN_FCLK1, thereby minimizing the unnecessary power consumption at high speed operation.

The first internal falling clock signal generator 210 generates the first internal falling clock signal IN_FCLK, synchronized with a falling edge of the external clock signal EXT_CLK. The first internal rising clock signal generator 220 generates the first internal rising clock signal IN_RCLK, synchronized with a rising edge of the external clock signal EXT_CLK.

The first internal falling clock signal generator 210 includes a delay unit 212 for receiving and delaying the external clock signal EXT_CLK, an inverter IV6 for inverting an output signal of the delay unit 212, and a NAND gate ND3 for logically combining an output signal of the inverter IV6 with the external clock signal EXT_CLK, and a delay unit 214 for delaying an output signal of the NAND gate ND3.

The internal rising clock signal generator 220 includes a delay unit 222 for receiving and delaying the external clock signal EXT_CLK, an inverter IV7 for inverting an output signal of the delay unit 222, and an NOR gate NR2 for logically combining an output signal of the inverter IV7 with the external clock signal EXT_CLK, an inverter IV8 for inverting an output signal of the NOR gate NR2, and a delay 224 for delaying an output signal of the inverter IV8.

Next, the buffer controller 230 receives the first internal rising clock signal IN_RCLK, the first internal falling clock signal IN_FCLK, the write standby signal WT_STDBY, the external clock enable signal CKEZ_COM, the RAS idle signal RAS_IDLE, and the output enable signal QSEN and generates the second internal rising and falling clock signals IN_RCLK1 and IN_FCLK1, and then produces a buffer control signal ENDINDS which is enabled only at the write operation region, synchronized with the second internal rising and falling clock signals IN_RCLK1 and IN_FCLK1.

The plurality of data input buffers 240 and the plurality of data strobe buffers 250 are enabled or disabled in accordance with the buffer control signal ENDINDS generated synchronously in response to the second internal rising and falling clock signals IN_RCLK1 and IN_FCLK1.

Here, the buffer controller 230 includes a second internal rising and falling clock signal generator 232, a first driver 234, a latch circuit 236, and a second driver 238.

The second internal rising and falling clock signal generator 232 receives the first internal falling clock signal IN_FCLK, the first internal rising clock signal IN_RCLK, the write standby signal WT_STDBY, the external clock enable signal CKEZ_COM, the RAS idle signal RAS_IDLE, and the output enable signal QSEN, and then generates the second internal rising and falling clock signals IN_RCLK and IN_FCLK1. The first driver 234 pulls up and pulls down an the second internal rising and falling clock signals IN_RCLK1 and IN_FCLK1 output from the second internal rising and falling clock signal generator 232.

The latch circuit 236 receives and latches an output signal of the first driver and a power up signal PWRUP. The second driver 238 receives an output signal of the latch circuit 236 and then generates the buffer control signal ENDINS.

The second internal rising and falling clock signal generator 232 includes an inverter IV9, a NAND gate ND4, a NOR gate NR3, a NAND gate ND5, and an inverter IV10.

The inverter IV9 inverts the write standby signal WT_STDBY. The NAND gate ND4 logically combines an output signal of the inverter IV9 with the first internal falling clock signal IN_FCLK, and then generates the second internal falling clock. signal IN_FCLK1. The NOR gate NR3 logically combines the external clock enable signal CKEZ_COM, the RAS idle signal RAS_IDLE, and the output enable signal QSEN. The NAND gate ND5 logically combines an output signal of the NOR gate NR3 with the first internal rising clock signal IN_RCLK. The inverter IV10 inverts an output signal of the NAND gate ND5 and then generates the second internal rising clock signal IN_RCLK1.

The first driver 234 includes a PMOS transistor P3 for pulling up the second internal rising clock signal IN_FCLK1 and an NMOS transistor N3 for pulling down the second internal rising clock signal IN_RCLK1.

The latch circuit 236 includes a NAND gate ND6 for logically combining an output signal of the first driver 234 with the power up signal PWRUP, and an inverter IV11 for inverting an output signal of the NAND gate ND6.

The second driver 238 includes PMOS and NMOS transistors P4 and N4 of inverter type for inverting an output signal of the latch circuit 236 and then generating the buffer control signal ENDINDS.

The buffer control circuit according to the second embodiment generates the second internal rising and falling clock signals IN_RCLK1 and IN_FCLK1 which are disabled at no write operation region and is enabled at the write operation region, and then produces the buffer control signal ENDINDS synchronously in response to the second internal rising and falling clock signals IN_RCLK1 and IN_FCLK1. Thereby, the data input buffers 240 and the data strobe buffers 250 operate only at the write operation region in response to the buffer control signal ENDINDS, resulting in minimizing the unnecessary power consumption of a semiconductor memory device.

The buffer control circuit enables the data input buffers 240 and the data strobe buffers 250, and then receives the input data when the buffer control signal ENDINDS is at the high level. Otherwise, it disables the data input buffers 240 and the data strobe buffers 250 and then doesn't receive the input data when the buffer control signal ENDINDS is at the low level.

Figure 6:
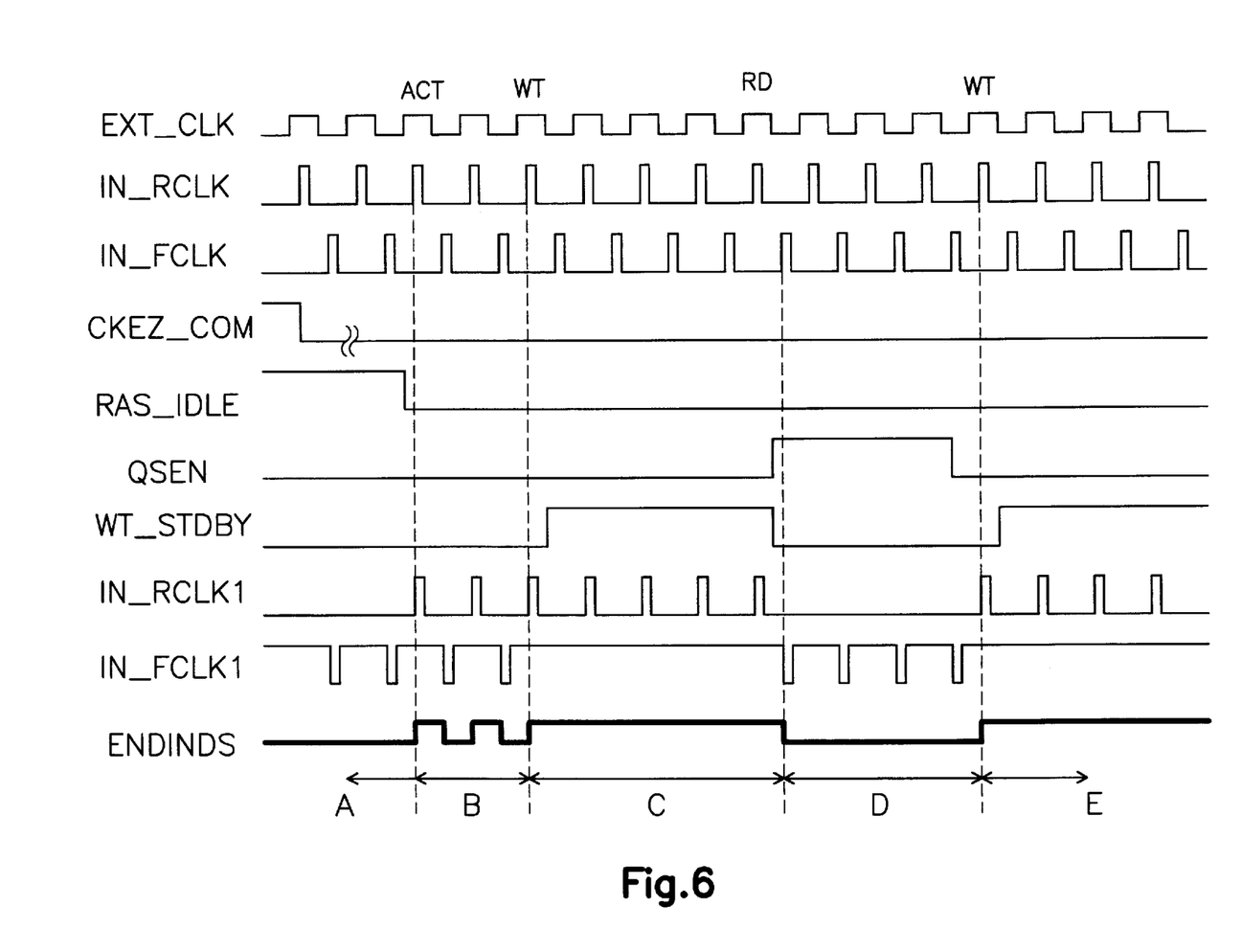
FIG. 6 is a timing diagram of main signals in the buffer control circuit of the semiconductor memory device according to the second embodiment of the invention.

Next, the timing of main signals that operate the data input buffers 240 and the data strobe buffers 250 only at the write operation region will be described with reference to FIG. 6, wherein various intervals of time are denoted by "A", "B", "C", "D" and "E" sections.

The first internal rising and falling clock signals IN_RCLK and IN_FCLK may use a DDL (Delay Locked Loop) clock signal. The write standby signal WT_STDBY is generated in response to a write command signal output from a command decoder (not shown).

In section A when the RAS idle signal RAS_IDLE is at the high level, the second internal rising clock signal IN_RCLK1 is disabled.

In section B, the buffer control signal ENDINDS toggles, thereby unnecessarily consuming the power of the semiconductor memory device. But the B section is required in that the buffer control signal ENDINDS must be activated faster than the write command signal.

Section C denotes a write operation interval in which the buffer control signal ENDINDS generates synchronously in response to the second internal rising clock signal IN_RCLK1 is activated faster than the write standby signal WT_STDBY generated in response to the write command signal. In section C, the second internal rising clock signal IN_RCLK1 goes up to the high and the second internal falling clock signal IN_FCLK1 goes down to the low level in response to the write standby signal WT_STDBY, resulting in maintaining the buffer control signal ENDINDS at the high level. As a result, data is received during interval C.

Interval D denotes a read operation section in which the second internal rising clock signal IN_RCLK1 goes down to the low level and the second internal falling clock signal IN_FCLK1 goes up to the high level in response to the output enable signal QSEN, resulting in maintaining the buffer control signal ENDINDS at the low level. As a result, section C doesn't receive the input data, thereby preventing the power consumption.

Section E is a write operation section in which the output enable signal QSEN already goes to the low level, and the second internal rising clock signal IN_RCLK1 goes to the high level, resulting in maintaining the buffer control signal ENDINDS at the high level. As a result, data is input during interval E.

Accordingly, the buffer control circuit according to the second embodiment generates the buffer control signal ENDINDS which is enabled only at the write operation region in response to the second internal rising and falling clock signals IN_RCLK1 and IN_FCLK1, enables the data input buffers 240 and the data strobe buffers 250 at the write operation region, and disables them ate no write operation region, in response to the buffer control signal ENDINDS. As a result, it is possible to achieve the data input buffer and the data strobe buffer having the stable high speed operation and the low power consumption.

The embodiments described above perform stable high-speed operation and minimize unnecessary power consumption at the high speed.

Although the preferred embodiments of the present invention have been disclosed for illustrative purpose, those skilled in the art will appreciate that various modifications, additions and substitutions are possible, without departing from the scope and spirit of the invention as described in the accompanying claims.

What is claimed is:

1. A circuit for controlling a plurality of data input buffers and a plurality of data strobe buffers in a semiconductor memory device comprising:
   a first internal falling clock signal generating means for generating a first internal falling clock signal from an external clock signal;
   a first internal rising clock signal generating means for generating a first internal rising clock signal from the external clock signal; and
   a buffer controlling means for generating a buffer control signal in response to the first and second falling and rising clock signals;
   wherein the plurality of data input buffers and the plurality of data strobe buffers are enabled or disabled in response to the buffer control signal.

2. The circuit of claim 1, wherein the first internal falling clock signal generating means generates the first internal falling clock signal in response to a falling edge of the external clock signal.

3. The circuit of claim 1, wherein the first internal falling clock signal generating means comprises:
   a first delay unit for delaying the external clock signal;
   a logic device for logically combining an inverted signal of an output signal of the first delay unit with the external clock signal; and
   a second delay unit for delaying an output signal of the logic device.

4. The circuit of claim 1, wherein the first internal rising clock signal generating means generates the first internal rising clock signal synchronously in response to the rising edge of the external clock signal.

5. The circuit of claim 1, wherein the first internal rising clock signal generating means comprises;
   a first delay unit for delaying the external clock signal;
   logic device for logically combining an inverted signal of an output signal of the first delay unit with the external clock signal; and
   a second delay unit for delaying an inverted signal of an output signal of the logic device.

6. The circuit of claim 1, wherein the buffer controlling means comprises;
   a first driver for receiving and pulling up and down the first rising clock signal, the first internal falling clock signal, and the write standby signal;
   a latch circuit for receiving and latching an output signal of the first driver and a power-up signal; and
   a second driver for receiving an output signal of the latch circuit and then generating the buffer control signal.

7. The circuit of claim 6, wherein the first driver comprises:
   a logic device for logically combining an inverted signal of the write standby signal with the first internal falling clock signal;
   a pull-up device for pulling up an output signal of the logic device; and
   a pull-down device for pulling down the first internal rising clock signal.

8. The circuit of claim 6, wherein the latch circuit includes a logic circuit for logically combining the first driver and a power-up signal.

9. The circuit of claim 6, wherein the second driver is an inverter.

10. The circuit of claim 1, wherein the buffer controller comprises:
    a second rising and falling clock signal generating unit for logically combining the first internal falling clock signal, the first internal rising clock combining the first internal falling clock signal, the first internal rising clock signal, the write standby signal, an external clock enable signal, a RAS idle signal, and an output enable signal, and generates the second internal rising clock signal and the second internal falling clock signal;
    a first driver for receiving and pulling up and down the second internal clock signal and the second internal falling clock signal;
    a latch circuit for receiving an output signal of the first driver and a power-up signal; and
    a second driver for receiving an output signal of the latch circuit, and generating the buffer control signal.

11. The circuit of claim 10, wherein the second internal rising and falling clock signal generating unit generates the second internal rising clock signal for enabling the buffer control signal only during a write operation region, and the second falling clock signal for disabling the buffer control signal when there is no write operation.

12. The circuit of claim 11, wherein the second internal rising and falling clock signal generating unit comprises;
   a first logic device for logically combining an inverted signal of the write standby signal and the first internal falling clock signal, and generating the second internal falling clock signal;
   a second logic device for logically combining the external clock enable signal, the RAS idle signal, and the output enable signal; and
   a logic circuit for logically combining an output signal of the second logic device and the first internal rising clock signal, and generating the second internal rising clock signal.

13. The circuit of claim 10, wherein the first driver comprises:
   a pull-up device for pulling up the second internal falling clock signal; and
   a pull-down device for pulling down the second internal rising clock signal.

14. The circuit of claim 10, wherein the latch circuit includes a logic circuit for logically combining the output signal of the first driver and a power-up signal.

15. The circuit of claim 6, wherein the second driver is an inverter.

16. The circuit of claim 1, wherein the plurality data input buffers and the plurality of data strobe buffers operate only during a write operation region in response to the buffer control signal generated synchronously in response to the second internal falling and rising clock signals.

17. A method for controlling a plurality of data input buffers and a plurality of data strobe buffers, the method comprising:
   generating a first internal falling clock signal and a first internal rising clock signal synchronously in response to an external clock signal;
   generating a buffer control signal in response to the first internal rising clock signal, the first internal falling clock signal, and a write standby signal; and
   enabling or disabling the plurality of data input buffers and the plurality of data strobe buffers in response to the buffer control signal.

18. The method of claim 17, wherein generating the buffer control signal comprises:
   generating a second internal rising clock signal and a second internal falling clock signal in response to the first internal rising clock signal, the first internal falling clock signal, the write standby signal, an external clock enable signal, a RAS idle signal, and an output enable signal; and
   generating the buffer control signal in response to the second internal falling and rising clock signals.

19. The method of claim 18, wherein the second internal rising clock signal enables the buffer control signal at an write operation region, and the second internal falling clock signal disables the buffer control signal at no write operation region.

20. The method of claim 18, wherein the buffer control signal generated synchronously in response to the second internal rising and falling clock signals operates the plurality of data input buffers and the plurality of data strobe buffers only at the write operation region.

* * * * *